United States Patent [19]

Kane et al.

[11] Patent Number: 5,290,610
[45] Date of Patent: Mar. 1, 1994

[54] FORMING A DIAMOND MATERIAL LAYER ON AN ELECTRON EMITTER USING HYDROCARBON REACTANT GASES IONIZED BY EMITTED ELECTRONS

[75] Inventors: Robert C. Kane; James E. Jaskie, both of Scottsdale, Ariz.

[73] Assignee: Motorola, Inc., Schaumburg, Ill.

[21] Appl. No.: 834,749

[22] Filed: Feb. 13, 1992

[51] Int. Cl.⁵ .......................... B05D 3/06; B05D 5/12; C23C 16/00; B01J 3/06
[52] U.S. Cl. ....................... 427/577; 427/78; 427/122; 427/249; 427/284; 423/446
[58] Field of Search .................. 427/577, 469, 77, 78, 427/122, 249, 284; 423/446

[56] References Cited

U.S. PATENT DOCUMENTS

| | | | |
|---|---|---|---|
| 3,259,782 | 7/1966 | Shroff | 427/78 |
| 3,947,716 | 3/1976 | Fraser, Jr. et al. | 427/78 |
| 4,663,183 | 5/1987 | Ovshinsky et al. | 427/577 |
| 4,859,490 | 8/1989 | Ikegaya et al. | 427/577 |
| 4,996,079 | 2/1991 | Itoh | 427/557 |
| 5,089,292 | 2/1992 | MaCaulay et al. | 427/78 |
| 5,093,151 | 3/1992 | van der Berg et al. | 427/577 |
| 5,110,405 | 5/1992 | Sawabe et al. | 427/577 |
| 5,169,452 | 12/1992 | Nakayama et al. | 427/577 |
| 5,176,557 | 1/1993 | Okunuki et al. | 427/77 |
| 5,185,067 | 2/1993 | Shibahara et al. | 427/577 |

FOREIGN PATENT DOCUMENTS

| | | |
|---|---|---|
| 62-103367 | 5/1987 | Japan . |
| 63-140083 | 6/1988 | Japan . |
| 63-224347 | 9/1988 | Japan . |
| 3-291380 | 12/1991 | Japan . |

*Primary Examiner*—Marianne Padgett
*Attorney, Agent, or Firm*—Eugene A. Parsons

[57] ABSTRACT

Depositing a diamond film on an electron emitting tip including disposing hydrocarbon and etchant reactant gasses together with the tip in a reaction vessel and providing an external voltage source such that electrons, emitted from the electron emitter, disassociate hydrocarbon constituents of the reactant gas. The constituents accelerate toward and are deposited onto the tip and are selectively etched by the etchant constituents such that only the diamond form of the deposited carbon remains.

20 Claims, 4 Drawing Sheets

5,290,610

FORMING A DIAMOND MATERIAL LAYER ON AN ELECTRON EMITTER USING HYDROCARBON REACTANT GASES IONIZED BY EMITTED ELECTRONS

FIELD OF THE INVENTION

This invention relates generally to methods of forming diamond films and more particularly to methods for selectively forming diamond films.

BACKGROUND OF THE INVENTION

It is known in the art that diamond films may be formed/deposited on a variety of substrate materials. It is further known that diamond film formation may be induced to preferentially take place at selectively treated locations on a surface of a substrate.

However, the prior art techniques may not be employed in instances where it is desirable to preferentially form/deposit diamond materials on physical features which may not be subjected to a selectivity treatment.

Accordingly there exists a need for a method which overcomes at least some of the shortcomings of the prior art and/or provides a new technique for selective diamond material deposition.

SUMMARY OF THE INVENTION

This need and others are substantially met through provision of a method for forming a diamond material layer on an electron emitter including the steps of: providing an electron emitter, for emitting electrons, disposed within a reaction vessel; and providing an extraction electrode disposed within the reaction vessel and distally disposed with respect to the electron emitter; and providing an external voltage source operably coupled between the extraction electrode and the electron emitter such that an externally applied voltage will induce an electric field at the electron emitter which may induce electron emission from the electron emitter; and providing a carbon bearing molecule reactant gas within the reaction vessel at least some of which is disposed in a region between the electron emitter and the extraction electrode; and providing an etching reactant within the reaction vessel at least some of which is disposed in the region between the electron emitter and the extraction electrode, such that at least some of any electrons emitted by the electron emitter electrode will at least partially disassociate at least some of the carbon bearing molecule reactant to positively ionized radicals which will be subsequently accelerated toward the electron emitter electrode to be deposited thereon and wherein at least some of the etching reactant will preferentially react with the deposited material to remove non-diamond formations of the deposited material at a rate higher than the removal of the diamond form.

DETAILED DESCRIPTION OF THE PREFERRED EMBODIMENTS

Figure 1:
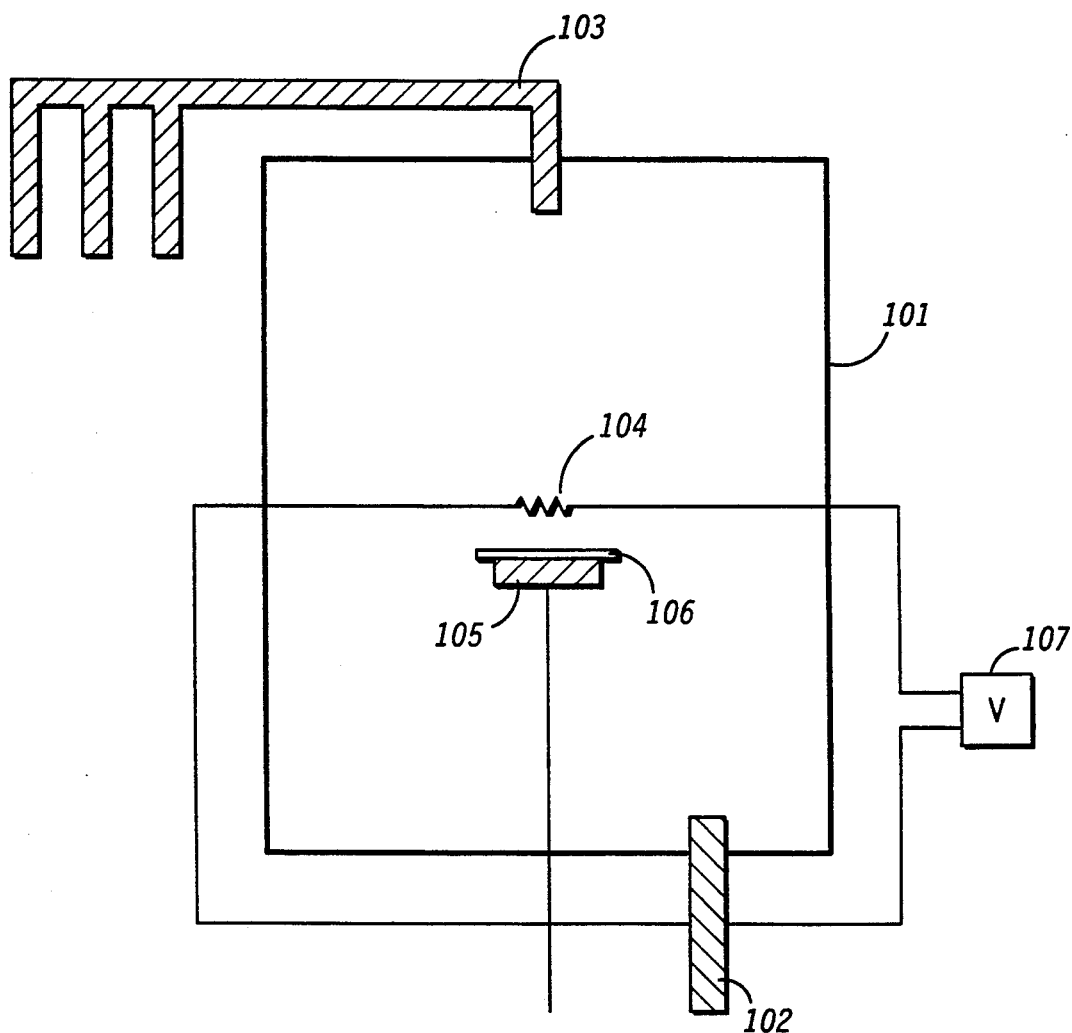
FIG. 1 is a schematical representation of one embodiment of a diamond film deposition reaction vessel of the prior art.

Referring now to FIG. 1 there is depicted schematically a reaction vessel 101 as is known in the art which is employed for deposition of material onto a substrate. Reaction vessel 101 defines a substantially evacuated enclosure to which a reactant source manifold 103 is operably connected. Manifold 103 is generally realized as a system of piping/tubing which has a plurality of input tubes attached to individual supplies of source reactants (not shown) and is further depicted as having a single output tube which provides a determined mixture of the source reactants into reaction vessel 101. An exhaust port 102 is comprised of a tube/pipe operably coupled to reaction vessel 101 so that reactants introduced into reaction vessel 101 are vented out. A substrate holder 105 is shown on which a substrate 106 is disposed within reaction vessel 101. A filament 104 is provided proximal to substrate 106 and operably coupled to an externally provided voltage source 107. Upon application of voltage source 107 to filament 104, filament 104 becomes heated and induces a reaction among the reactant gasses which have been introduced into reaction vessel 101 via manifold 103. The reaction which takes place in the vicinity of/on the substrate surface provides for material deposition onto the substrate surface.

In the instance of the present disclosure the material of interest, which is to be deposited onto the substrate surface is diamond material which may be of either a single crystalline or polycrystalline form.

Figure 2:
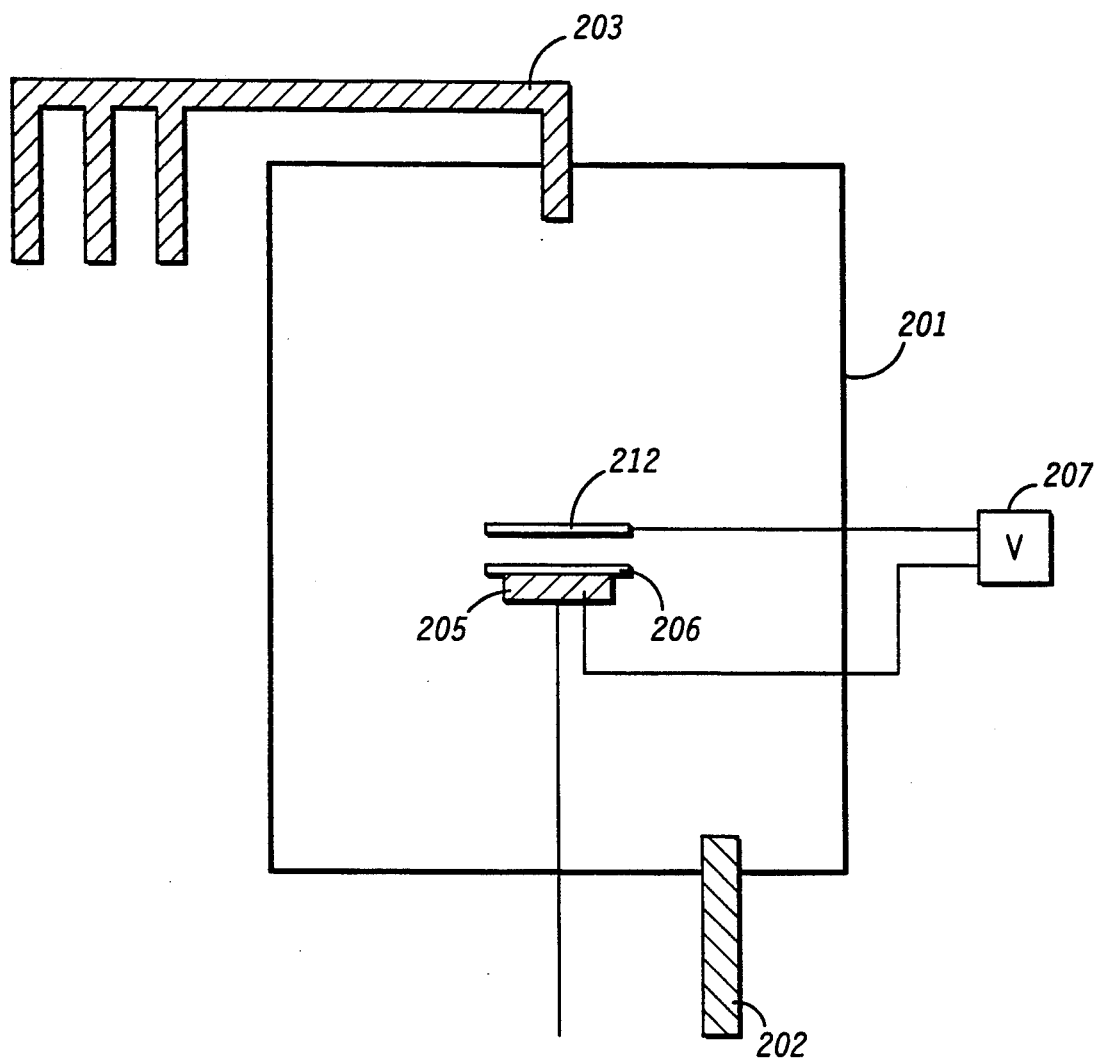
FIG. 2 is a schematical representation of a diamond film reaction vessel in accordance with the present invention.

FIG. 2 is a schematical representation of a material deposition reaction vessel 201 which is employed in accordance with a method of the present invention. Reaction vessel 201 defines a substantially evacuated enclosure to which a reactant source manifold 203 is operably coupled as described previously with reference to FIG. 1. There is also depicted in FIG. 2 an exhaust port 202 and a substrate holder 205, both of which are structures similar to those previously described with reference to FIG. 1. FIG. 2 further depicts that an externally provided voltage source 207 is operably coupled between substrate holder 205 and an extraction electrode 212. For the method now under consideration a supporting substrate 206 is operably connected to and disposed on substrate holder 205. So configured and connected, voltage source 207 induces an electric field at substrate 206.

Figure 3:
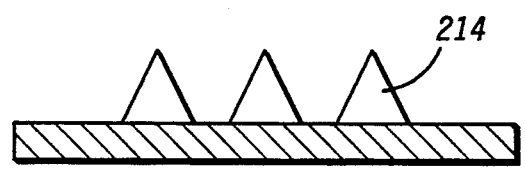
FIG. 3 is a greatly magnified, side elevational schematical representation of a part of an electron emitter employed in the structure of FIG. 2.

FIG. 3 is a greatly enlarged view of a portion of supporting substrate 206 of FIG. 2 illustrating a plurality of electron emitters 214 formed on a surface thereof. Electron emitters 214 are selectively formed on and operably coupled to supporting substrate 206 by any of many methods commonly employed and discussed in the known art.

Consider now a method wherein electron emitters 214, including the structure described in FIG. 3, are disposed within reaction vessel 201, a mixture of reactant gasses is introduced into reaction vessel 201 via reactant source manifold 203, electron emission is induced into a region between extraction electrode 212 and substrate 206 by means of the electric field induced by voltage source 207, at least some reactant species, disposed in the region, are disassociated into positively radicalized ions, at least some radicalized ions are preferentially accelerated toward and deposited onto the more negative electron emitters, and some other of the reactant constituents preferentially/selectively remove some forms of the deposited reactant material, such that the deposited material which remains is substantially diamond material.

In the method described, the reactant constituent to be radicalized and deposited is preferentially a carbon bearing molecule such as, for example, but not limited to methane, butane, propane, and acetylene. The reactant species employed to selectively remove unwanted forms of the deposited material is, for example, hydrogen.

In one specific method described, radicalization (disassociation) of the carbon bearing molecule constituent is accomplished by means of electron energy coupled to the carbon bearing molecule reactant The electrons are emitted into the region by means of electric field induced field emission from electron emitters 214. By so doing carbon bonding is desirably disrupted to yield a radicalized carbon bearing molecule. As the radicalized carbon bearing molecule is positively ionized it is attracted to the more negative electron emitter and preferentially deposited thereon. Another reactant species, such as hydrogen, present in reaction vessel 201 attacks undesirable formations of the deposited carbon bearing molecule constituent, such as graphite forms of carbon, more quickly than the desired form of the deposited carbon bearing molecule constituent, such as the diamond form of carbon, to yield a reaction rate which favors formation of diamond on the surface of electron emitters 201.

In one specific method carbon bearing molecule radicalization, induced by electron energy coupling, is provided by a substantially uninterrupted (DC) supply of emitted electrons. In another specific method herein referred to as pulsed mode operation, carbon bearing molecule radicalization is provided by a pulsed supply of emitted electrons. In the instance of pulsed mode operation, the repetition rate (pulse frequency) may be on the order of Megahertz. A desirable feature of employing the pulsed mode operation is that radicalized carbon bearing molecules are provided with an opportunity for unimpeded transit to the electron emitter surface. In the instances of pulsed mode operation externally provided voltage source 207 effects the pulsed mode by providing a non-constant voltage (non-DC voltage) between extraction electrode 212 and substrate holder 205.

Figure 4:
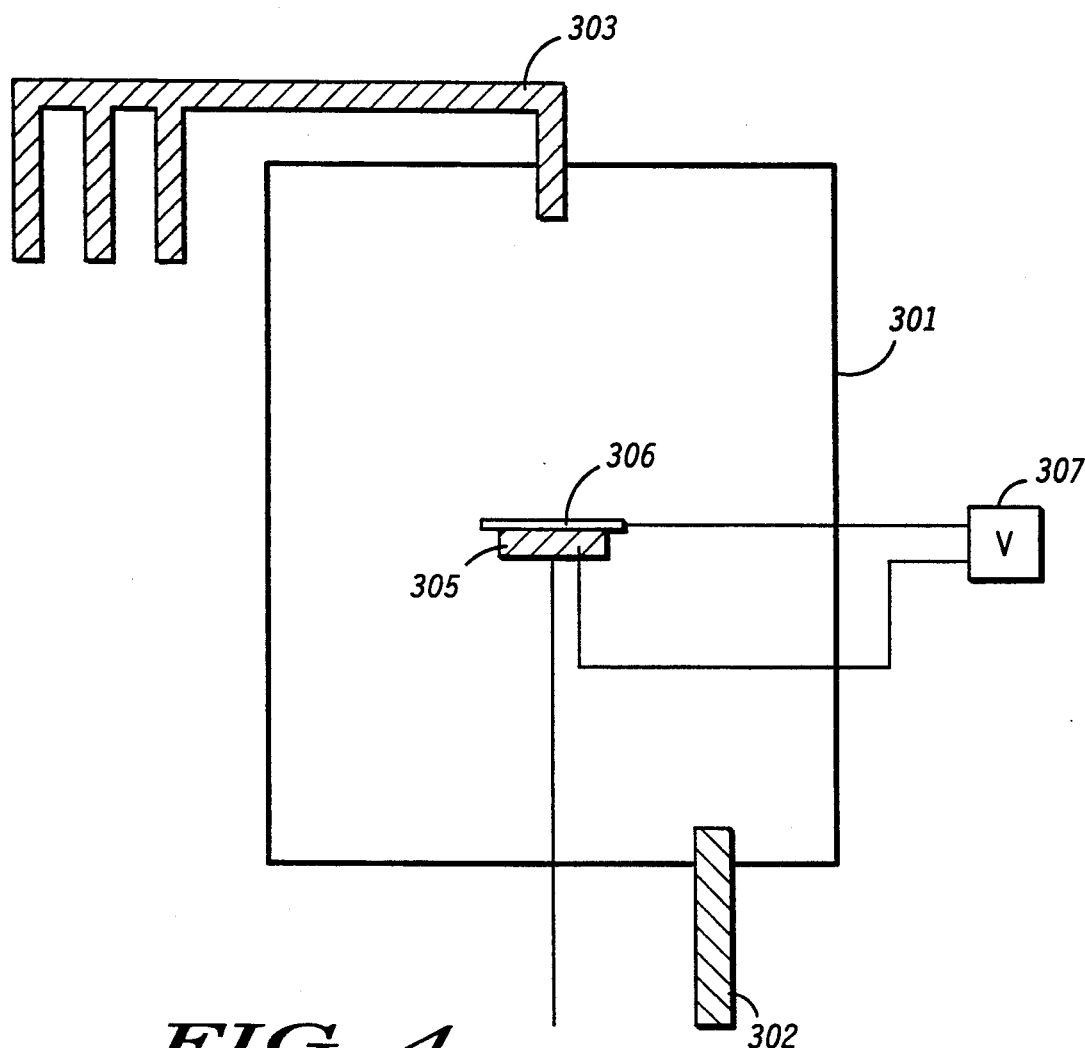
FIG. 4 is a schematical representation of a diamond film reaction vessel in accordance with the present invention.
Figure 5:
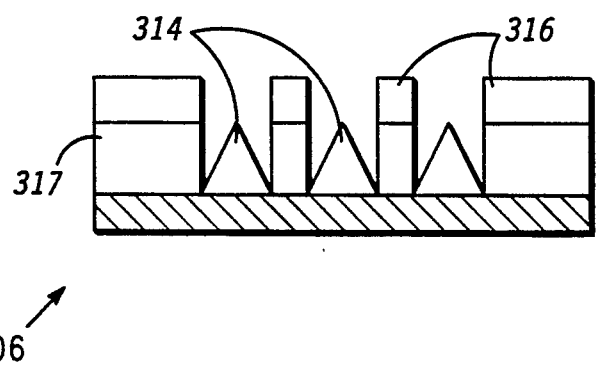
FIG. 5 is a greatly magnified side elevational schematical representation of an electron emitter employed in the structure of FIG. 4.

Referring now to FIG. 4 there is shown a schematical representation of a reaction vessel 301 in accordance with the present invention and as described previously with reference to FIG. 2 and wherein features first described with reference to FIG. 2 are similarly referenced beginning with the numeral "3". FIG. 4 includes an exhaust port 302, a substrate holder 305, and an externally provided voltage source 307 operably coupled between substrate holder 305 and a supporting substrate 306 positioned on substrate holder 305. FIG. 5 illustrates a greatly magnified portion of supporting substrate 306 including electron emitters 314 each disposed in an aperture of a plurality of apertures and on a surface of supporting substrate 306. The plurality of apertures are defined by an insulating layer 317 deposited on supporting substrate 306 with an extraction electrode 316 formed thereon and having the plurality of apertures formed therethrough.

Referring to FIG. 4, voltage source 307 is operably coupled between extraction electrode 316 of supporting substrate 306 and substrate holder 305 so that an electric field is induced at supporting substrate 306 proximal to electron emitters 314. By so doing, and as is known in the art, electrons are emitted from electron emitters 314 into the region about electron emitters 314. The emitted electrons couple energy to carbon bearing molecule constituents of the reactant gasses to initiate the reaction described previously with reference to FIG. 2 and yield a preferentially deposited diamond film.

Figure 6:
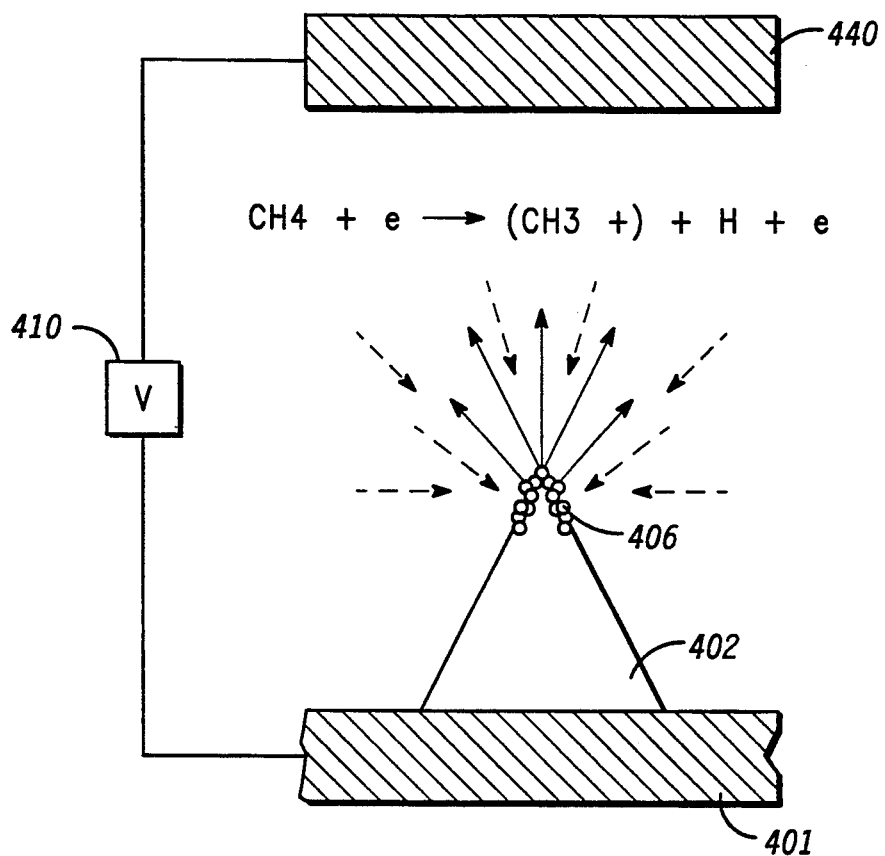
FIG. 6 is a greatly enlarged side elevational cross sectional depiction of an embodiment of a selectively diamond coated electron emitter realized by performing a method in accordance with the present invention.

FIG. 6 is a greatly enlarged side elevational cross sectional depiction of an electron emission structure such as described previously with reference to FIG. 3 and further depicting a preferentially/selectively deposited diamond material layer. A supporting substrate 401 has an electron emitting tip 402 disposed on and operably coupled to the surface thereof. An extraction electrode 440 is distally disposed with respect to supporting substrate 401 such that a region is defined therebetween. An externally provided voltage source 410 is operably coupled between extraction electrode 440 and supporting substrate 401. Application of voltage source 410 induces electrons to be emitted from emitting tip 402 into the region.

The structure described thus far is preferentially disposed within an environment similar to that described previously with reference to FIG. 2 wherein reactant gasses are present and, therefore, reactant gasses are present within the region. Electrons emitted into the region (represented by arrows directed outward from emitting tip 402) impart energy to carbon bearing molecule constituents of the reactant gasses to positively ionize the carbon bearing molecule. Subsequently, the radicalized carbon bearing ions are accelerated (represented by dashed arrows directed toward emitting tip 402) toward the negative electron emitting tip 402 and deposited thereon. The etchant constituent of the reactant gasses preferentially react with non-diamond forms of the deposited material such that a layer/film of diamond material 406 is preferentially/selectively deposited onto emitting tip 402.

As depicted in FIG. 6 the deposition need not include formation of a diamond film over the full extent of emitting tip 402. Since regions of high energy are associated with geometric discontinuities carbon bearing molecule nucleation and, subsequently, diamond film formation proceeds preferentially at just such a part of emitting tip 402 after carbon bearing molecule radicalization has been effected.

Figure 7:
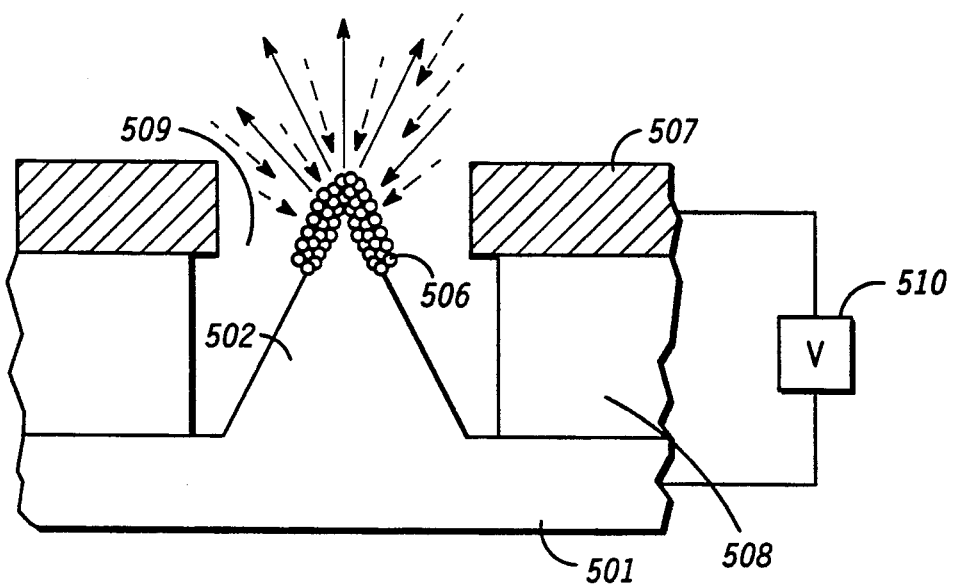
FIG. 7 is a greatly enlarged side elevational cross sectional depiction of another embodiment of a selectively diamond coated electron emitter realized by performing a method in accordance with the present invention.

FIG. 7 is a greatly enlarged side elevational crosssectional depiction of an electron emitter 502 similar to that described previously with reference to FIG. 5. A supporting substrate 501 is provided on which is disposed electron emitter 502, for emitting electrons. An insulator layer 508 is disposed on the surface of supporting substrate 501 and an extraction electrode 507 is disposed on insulator layer 508. As is known in the art, electron emitter 502 may be realized by first depositing insulator layer 508 and extraction electrode 507, etching an aperture 509 into extraction electrode 507 and insulator layer 508, and subsequently depositing electron emitter 502 into aperture 509 on the surface of supporting substrate 501. So formed and disposed within an environment similar to that described previously with reference to FIG. 4 and having an externally provided voltage source 510 operably connected, a diamond material layer 506 will be preferentially/selectively deposited onto at least a part of electron emitter 502.

A method for selectively depositing a diamond film onto at least a part of the electron emitting tip of an electron emitter is disclosed. Further, a method for forming a diamond film which employs emitted electrons to impart energy to carbon bearing molecules which may be subsequently deposited onto electron emitting tips has been disclosed. Also, apparatus including a diamond film layer disposed on at least part of any electron emitting tips is described. Thus, methods to preferentially form/deposit diamond materials on physical features which may not be subjected to a selectivity treatment are disclosed and the resulting apparatus is also disclosed.

While we have shown and described specific embodiments of the present invention, further modifications and improvements will occur to those skilled int he art. We desire it to be understood, therefore, that this invention is not limited to the particular forms shown and we intend in the append claims to cover all modifications that do not depart from the spirit and scope of this invention.

What is claimed is:

1. A method for forming a diamond material layer on an electron emitter including the steps of:
    providing a reaction vessel;
    disposing an electron emitter within the reaction vessel;
    disposing an extraction electrode within the reaction vessel and distally disposed with respect to the electron emitter to define a region therebetween;
    coupling a voltage source between the extraction electrode and the electron emitter such that an electric field is induced at the electron emitter which induces electron emission from the electron emitter;
    providing an unactivated carbon bearing molecular reactant gas within the reaction vessel in the region between the electron emitter and the extraction electrode such that electrons emitted by the electron emitter disassociate some of the carbon reactant gas to positively ionized radicals, which radicals are subsequently accelerated toward the electron emitter and deposited thereon; and
    providing an etching reactant within the reaction vessel in the region between the electron emitter and the extraction electrode, such that the etching reactant preferentially reacts with the deposited radicals to remove non-diamond formations of the deposited radicals at a rate higher than the removal of diamond form.

2. The method of claim 1 including the step of periodically switching the voltage source on/off.

3. The method of claim 1 including the step of pulsing the voltage source.

4. The method of claim 3 including the step of pulsing the voltage source at a pulse rate on the order of at least one Mega-Hertz.

5. A method for forming a diamond material layer on an electron emitter including the steps of:
    providing a reaction vessel;
    disposing an electron emitting structure within the reaction vessel, the electron emitting structure including a supporting substrate having a surface on which is disposed an insulating layer with at least an aperture formed through the insulating layer, an extraction electrode disposed on the insulating layer and about the periphery of the aperture, and an electron emitting tip disposed int he aperture and operably coupled to the supporting substrate;
    coupling a voltage source between the extraction electrode and the supporting substrate for inducing the emission of electrons from the electron emitting tip;
    providing hydrocarbon reactant gases within the reaction vessel such that at least some electrons emitted by the electron emitting tip at least partially disassociate some of the hydrocarbon gasses to positively ionized radicals, which radicals are subsequently accelerated toward the electron emitting tip and deposited thereon; and
    providing an etching reactant within the reaction vessel such that the etching reactant preferentially reacts with the deposited radicals to remove non-diamond formations of the deposited radicals at a rate higher than the removal of diamond form.

6. The method of claim 5 including the step of periodically switching the voltage source on/off.

7. The method of claim 5 including the step of pulsing the voltage source.

8. The method of claim 7 including the step of pulsing the voltage source at a pulse rate on the order of at least one Mega-Hertz.

9. A method for forming a diamond material layer on an electron emitter including the steps of:
    providing a reaction vessel;
    disposing an electron emitting structure within the reaction vessel, the electron emitting structure including a supporting substrate having a surface on which is disposed an insulating layer with an aperture formed through the insulating layer, an extraction electrode disposed on the insulating layer and about the periphery of the aperture, and an electron emitting tip disposed in the aperture and operably coupled to the supporting substrate;
    coupling a voltage source between the extraction electrode and the supporting substrate for inducing the emission of electrons from the electron emitting tip;
    providing a hydrocarbon reactant within the reaction vessel such that some emitted electrons at least partially disassociate some of the hydrocarbon reactant to positively ionized radicals, which radicals are subsequently accelerated toward the electron emitting tip to be deposited thereon; and
    providing an etching reactant within the reaction vessel, such that the etching reactant preferentially reacts with the deposited radicals to remove non-diamond formations of the deposited radicals at a rate higher than the removal of diamond form.

10. The method of claim 9 including the step of periodically switching the voltage source on/off.

11. The method of claim 9 including the step of pulsing the voltage source.

12. The method of claim 11 including the step of pulsing the voltage source at a pulse rate on the order of at least one Mega-Hertz.

13. A method for forming a diamond material layer on an electron emitter including the steps of:
provided a reaction vessel;
disposing an electron emitting structure within the reaction vessel, the electron emitting structure including a supporting substrate having a surface, a conductive layer disposed on the surface of the supporting substrate, an insulating layer having an aperture formed through the insulating layer and disposed on the surface of the supporting substrate, an extraction electrode disposed on the insulating layer and about the periphery of the aperture, and an electron emitting tip disposed in the aperture on the conductive layer;
coupling a voltage source between the extraction electrode and the conductive layer for inducing the emission of electrons from the electron emitting tip;
providing a hydrocarbon reactant within the reaction vessel such that some electrons emitted by the electron emitting tip at least partially disassociate some of the hydrocarbon reactant to positively ionized radicals, which radicals are subsequently accelerated toward the electron emitting tip to be deposited thereon; and
providing an etching reactant within the reaction vessel, such that the etching reactant preferentially reacts with the deposited radicals to remove non-diamond formations of the deposited radicals at a rate higher than the removal of diamond form.

14. The method of claim 13 including the step of periodically switching the voltage source on/off.

15. The method of claim 13 including the step of pulsing the voltage source.

16. The method of claim 15 including the step of pulsing the voltage source at a pulse rate on the order of at least one Mega-Hertz.

17. A method for forming a diamond material layer on a plurality of electron emitters including the steps of:
providing a reaction vessel;
disposing an electron emitting structure within the reaction vessel, the electron emitting structure including a supporting substrate having a surface, a conductive layer disposed on the surface of the supporting substrate, an insulating layer having a plurality of apertures formed therethrough and disposed on the surface of the supporting substrate, an extraction electrode disposed on the insulating layer and about the periphery of the plurality of apertures, and a plurality of electron emitting tips one each disposed in an aperture of the plurality of apertures and on the conductive layer;
coupling a voltage source between the extraction electrode and the conductive layer for inducing the emission of electrons from the electron emitting tips;
providing a hydrocarbon reactant within the reaction vessel such that some emitted electrons at least partially disassociate some of the hydrocarbon reactant to positively ionized radicals, which radicals are subsequently accelerated toward the electron emitting tip and are deposited thereon; and
providing an etching reactant within the reaction vessel, such that the etching reactant preferentially reacts with the deposited radicals to remove non-diamond formations of the deposited radicals at a rate higher than the removal of diamond form.

18. The method of claim 17 including the step of periodically switching the voltage source on/off.

19. The method of claim 17 including the step of pulsing the voltage source.

20. The method of claim 19 including the step of pulsing the voltage source at a pulse rate on the order of at least one Mega-Hertz.

* * * * *